US009331042B2

(12) United States Patent
Sakurai et al.

(10) Patent No.: US 9,331,042 B2
(45) Date of Patent: May 3, 2016

(54) SEMICONDUCTOR DEVICE MANUFACTURING METHOD AND SEMICONDUCTOR DEVICE (71) Applicant: Panasonic Corporation, Kadoma-shi, Osaka (JP)

(72) Inventors: Daisuke Sakurai, Osaka (JP); Kazuya Usirokawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 13 days.

(21) Appl. No.: 14/360,228

(22) PCT Filed: Nov. 16, 2012

(86) PCT No.: PCT/JP2012/007352
§ 371 (c)(1),
(2) Date: May 22, 2014

(87) PCT Pub. No.: WO2013/108323
PCT Pub. Date: Jul. 25, 2013

(65) Prior Publication Data
US 2014/0299986 A1      Oct. 9, 2014

(30) Foreign Application Priority Data
Jan. 17, 2012    (JP) .................................. 2012-006630

(51) Int. Cl.
*H01L 23/488*      (2006.01)
*H01L 23/00*       (2006.01)

(52) U.S. Cl.
CPC ................ *H01L 24/17* (2013.01); *H01L 24/13* (2013.01); *H01L 24/14* (2013.01); *H01L 24/16* (2013.01);

(Continued)

(58) Field of Classification Search
None
See application file for complete search history.

(56) References Cited

U.S. PATENT DOCUMENTS 6,122,177 A    9/2000    Kitano et al.
6,448,646 B1   9/2002    Kitano et al.
(Continued)

FOREIGN PATENT DOCUMENTS

JP    59-005637     1/1984
JP    H09-097791    4/1997
(Continued)

OTHER PUBLICATIONS

Taiwanese Office Action, Jun. 18, 2015; Taiwanese Patent Application No. 101144541 (6 pages).
(Continued)

*Primary Examiner* — Fei Fei Yeung Lopez
(74) *Attorney, Agent, or Firm* — Hamre, Schumann, Mueller & Larson, P.C.

(57) ABSTRACT

A plurality of protruding electrodes of a semiconductor chip are in contact with a plurality of electrodes formed on a semiconductor substrate, via a plurality of solder sections. In this state, the solder sections are melted so as to form a plurality of solder bonding sections joined to the protruding electrodes of the semiconductor chip and the electrodes of the semiconductor substrate. Moreover, a distance between a part of the semiconductor chip and the semiconductor substrate is larger than a distance between the other part of the semiconductor chip and the semiconductor substrate, extending at least some of the solder bonding sections. Thus, the solder bonding sections vary in height. Holes are then formed at least in a solder bonding section having a maximum height out of the solder bonding sections. After that, the solder bonding sections are solidified.

12 Claims, 5 Drawing Sheets

(52) U.S. Cl.
CPC ............... *H01L 24/81* (2013.01); *H01L 24/95* (2013.01); *H01L 24/03* (2013.01); *H01L 24/05* (2013.01); *H01L 24/11* (2013.01); *H01L 24/32* (2013.01); *H01L 24/83* (2013.01); *H01L 24/94* (2013.01); *H01L 24/97* (2013.01); *H01L 2224/0345* (2013.01); *H01L 2224/0401* (2013.01); *H01L 2224/05111* (2013.01); *H01L 2224/05139* (2013.01); *H01L 2224/05166* (2013.01); *H01L 2224/05184* (2013.01); *H01L 2224/05647* (2013.01); *H01L 2224/1147* (2013.01); *H01L 2224/1181* (2013.01); *H01L 2224/11462* (2013.01); *H01L 2224/11464* (2013.01); *H01L 2224/11849* (2013.01); *H01L 2224/13082* (2013.01); *H01L 2224/13109* (2013.01); *H01L 2224/13111* (2013.01); *H01L 2224/13144* (2013.01); *H01L 2224/13147* (2013.01); *H01L 2224/13155* (2013.01); *H01L 2224/1601* (2013.01); *H01L 2224/16058* (2013.01); *H01L 2224/16225* (2013.01); *H01L 2224/16227* (2013.01); *H01L 2224/16238* (2013.01); *H01L 2224/16501* (2013.01); *H01L 2224/16503* (2013.01); *H01L 2224/16505* (2013.01); *H01L 2224/1703* (2013.01); *H01L 2224/17055* (2013.01); *H01L 2224/32225* (2013.01); *H01L 2224/73204* (2013.01); *H01L 2224/8109* (2013.01); *H01L 2224/8121* (2013.01); *H01L 2224/81065* (2013.01); *H01L 2224/81193* (2013.01); *H01L 2224/81203* (2013.01); *H01L 2224/81385* (2013.01); *H01L 2224/81444* (2013.01); *H01L 2224/81815* (2013.01); *H01L 2224/81935* (2013.01); *H01L 2224/81986* (2013.01); *H01L 2224/83102* (2013.01); *H01L 2224/94* (2013.01); *H01L 2224/97* (2013.01); *H01L 2924/12042* (2013.01); *H01L 2924/181* (2013.01); *H01L 2924/351* (2013.01); *H01L 2924/3512* (2013.01); *H01L 2924/35121* (2013.01); *H01L 2924/381* (2013.01); *H01L 2924/3841* (2013.01)

(56) References Cited

U.S. PATENT DOCUMENTS

| | | | |
|---|---|---|---|
| 7,202,569 | B2 | 4/2007 | Tomono |
| 8,367,539 | B2 | 2/2013 | Sakurai |
| 2011/0233767 | A1* | 9/2011 | Sakurai .................. 257/737 |
| 2011/0278056 | A1 | 11/2011 | Takeuchi et al. |

FOREIGN PATENT DOCUMENTS

| | | |
|---|---|---|
| JP | 10-275828 | 10/1998 |
| JP | 11-214447 | 8/1999 |
| JP | 2003-59970 A | 2/2003 |
| JP | 2003-282617 | 10/2003 |
| JP | 2004-319564 | 11/2004 |
| JP | 2005-167045 | 6/2005 |
| JP | 2005-174981 | 6/2005 |
| JP | 2006-054360 | 2/2006 |
| JP | 3848723 | 11/2006 |
| JP | 4220440 | 2/2009 |
| JP | 4492330 | 6/2010 |
| JP | 2011-096803 | 5/2011 |
| JP | 2011-210773 | 10/2011 |
| JP | 2011-243683 | 12/2011 |
| JP | 5375708 | 12/2013 |

OTHER PUBLICATIONS

Office Action issued in corresponding Korean Patent Application No. 2014-7014588 on Oct. 21, 2015.

* cited by examiner

SEMICONDUCTOR DEVICE MANUFACTURING METHOD AND SEMICONDUCTOR DEVICE

TECHNICAL FIELD

The present invention relates to a semiconductor device manufacturing method and a semiconductor device manufactured by the manufacturing method.

BACKGROUND ART

In recent years, the areas of the electrode terminals of a semiconductor chip and a center distance between adjacent electrode terminals in a semiconductor chip have been reduced (smaller pitches of the electrode terminals) so as to increase the density of semiconductor chips and the number of pins on the electrode terminals of the semiconductor chips.

Typically, in flip-chip packaging, semiconductor chips such as an LSI are mounted face down on a mounting substrate. Specifically, protruding electrodes such as solder bumps are formed on the electrode terminals of a semiconductor chip, and then the protruding electrodes' are heated and pressed to the electrode terminals of the mounting substrate. This forms bump connections.

Generally, electrode terminals are disposed on the outer periphery of a semiconductor chip. However, a center distance between adjacent electrode terminals has been considerably reduced and thus if electrode terminals are only disposed on the outer periphery of a semiconductor chip, a short circuit may occur between the electrode terminals or a faulty connection may be caused by a difference in thermal expansion coefficient between the semiconductor chip and a mounting substrate.

To address this problem, electrode terminals have been disposed over the electrode surfaces of semiconductor chips (area layout). The layout of the electrode terminals can increase a center distance (the pitch of the electrode terminals) between the adjacent electrode terminals. In recent years, however, a center distance between adjacent electrode terminals has been considerably reduced also in the layout of electrode terminals disposed over the electrode surface of a semiconductor chip.

Solder bumps are generally formed by the following method: first, solder is supplied onto electrode terminals by screen printing, a dispenser, or electrolytic plating, and then the supplied solder is heated at least to the melting point of solder in a reflow furnace. This forms protruding solder bumps on the electrode terminals.

In recent years, however, a center distance between adjacent solder bonding sections (the pitches of solder bonding sections) has been further reduced. Additionally, a clearance between a semiconductor chip and a mounting substrate has been also reduced. This may cause problems such as a "faulty solder bridge". Such a "faulty solder bridge" is caused by molten solder deformed so as to join solder bumps with a solder surface tension in the heating step of flip-chip packaging. In order to solve such a "faulty solder bridge", a bump having a two-layer structure has been proposed so as to reduce the amount of solder. For example, in Patent Literature 1, proposed bumps each have a two-layer structure composed of an insulating coating containing metallic particles over the surface of a protruding electrode made of gold or copper. The proposed bumps prevent the insulating coating and the protruding electrode from melting during flip-chip packaging, thereby avoiding the occurrence of "faulty solder bridges". This allows a smaller center distance between adjacent electrode terminals. The bumps disclosed in Patent Literature 1 are electrically connected to the electrode terminals of a mounting substrate by a force generated in the compressing direction of molding resin when the molding resin injected between a semiconductor chip and the mounting substrate hardens and shrinks.

In recent years, however, a smaller center distance between adjacent electrode terminals has been required. Thus, the areas of the electrode terminals have been reduced. If the bumps disclosed in Patent Literature 1 are used in a semiconductor chip, metallic particles in the insulating coating are not diffusion bonded to the protruding electrodes (metal electrodes) of the semiconductor chip or the electrode terminals (metal electrodes) of a mounting substrate. The protruding electrodes of the semiconductor chip and the electrode terminals of the mounting substrate are electrically connected to each other only by bringing metallic particles in the insulating coating into contact with the protruding electrodes (metal electrodes) of the semiconductor chip and the electrode terminals (metal electrodes) of the mounting substrate. Thus, if the areas of the electrodes are reduced, the number of conductive particles decreases between the protruding electrodes of the semiconductor chip and the electrode terminals of the mounting substrate, disadvantageously increasing a connection resistance and a signal transmission loss.

To address this problem, recent bumps each have a two-layer structure including a solder upper metal on a lower metal composed of a refractory metal (For example, see Patent Literature 2). The bump having the two-layer structure can reduce the amount of solder as compared to a single-layer bump only made of solder. This reduces the amount of solder protruding in a plane direction during flip-chip packaging, thereby preventing the occurrence of solder bridges. Furthermore, the solder of the upper metal is diffusion bonded to the lower metal (protruding electrodes) provided on a semiconductor chip and the electrode terminals of a mounting substrate. This reduces a connection resistance and does not increase a signal transmission loss.

CITATION LIST

Patent Literatures

Patent Literature 1: Japanese Patent Laid-Open No. 2003-282617

Patent Literature 2: Japanese Patent Laid-Open No. 9-97791

SUMMARY OF INVENTION

Technical Problems

However, in response to recently demanded finer design rules and faster signal processing (high-speed signal processing), low dielectric constant films (including a so-called Low-k film and a ULK (Ultra Low-k) film) have been used as interlayer insulating films for semiconductor chips. A low dielectric constant film is a porous film having multiple holes for reducing a dielectric constant. The holes are several nm in diameter (maximum width).

Figure 5:
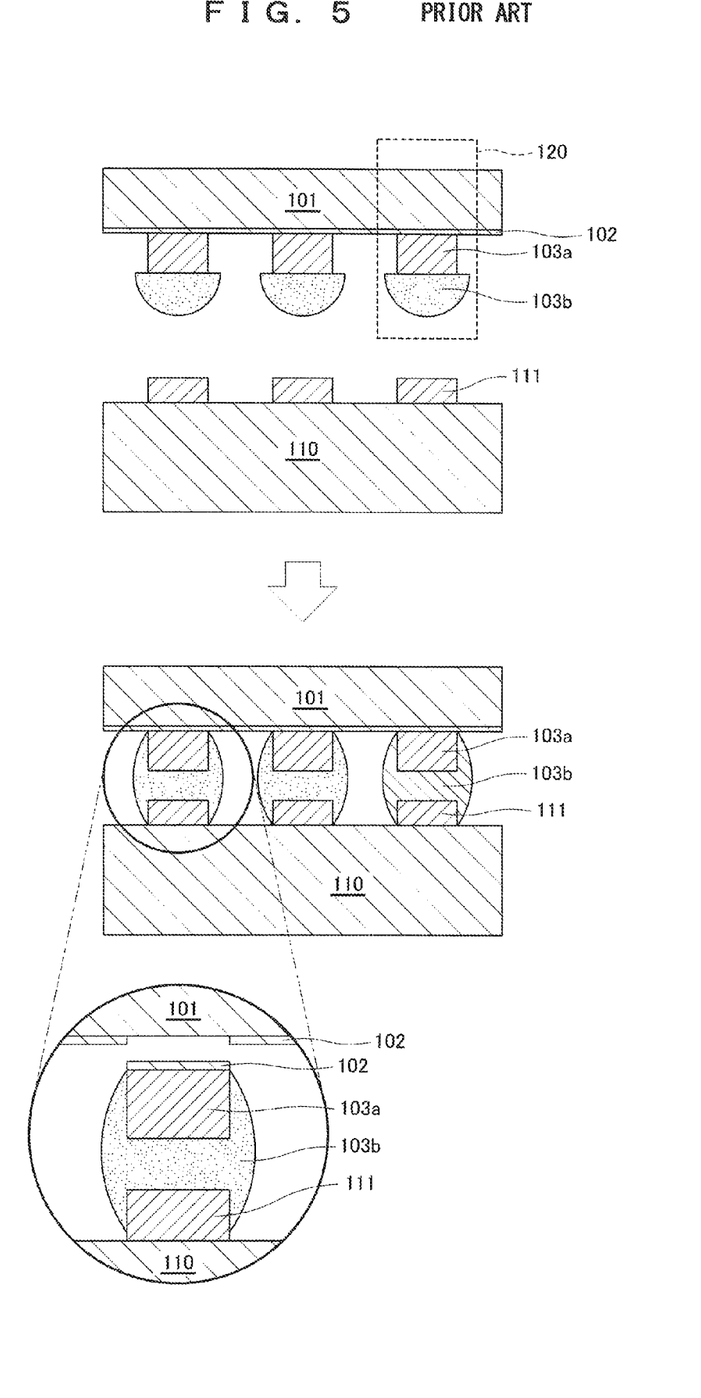
FIG. 5 is a cross-sectional view showing a manufacturing process of a conventional semiconductor device.

FIG. 5 shows a manufacturing process of a semiconductor device disclosed in Patent Literature 2.

First, before a semiconductor chip 101 is mounted on a circuit board 110 by flip-chip packaging, as shown in the upper part of FIG. 5, bumps 120 are formed on the semiconductor chip 101. The bump 120 is composed of two layers: a lower layer 103a and an upper layer 103b. The upper layer 103b is made of solder, whereas the lower layer 103a is made of a refractory metal having a higher melting point than solder. Subsequently, the heated bumps 120 come into contact with electrodes 111 on the circuit board 110. Thus, the upper layer (solder) 103b having a lower melting temperature than the lower layer 103a is melted such that, as shown in the middle part of FIG. 5, the lower metal 103a provided on the semiconductor chip 101 is diffusion-bonded to the solder of the upper layer 103b and the electrodes 111 on the circuit board 110 are diffusion-bonded to the solder of the upper layer 103b.

Generally, if a semiconductor chip having a rectangular outside shape is mounted on a mounting substrate by flip-chip packaging, a thermal stress caused by a difference in modulus of elasticity and coefficient of linear expansion between the semiconductor chip and the mounting substrate frequently concentrates on solder bumps disposed near the four corners of the adjacent sides of the semiconductor chip in a cooling process after the solder bumps are melted.

In the semiconductor device manufacturing method disclosed in Patent Literature 2, a thermal stress concentrating on the solder of the upper layer 103b is directly transmitted immediately under the lower metal 103a. Thus, a fragile low dielectric constant film 102 may be peeled off or cracked directly under electrode terminals (not shown) including the lower metal 103a. For example, if a thermal stress caused by a difference in modulus of elasticity and coefficient of linear expansion between the semiconductor chip 101 and the circuit board 110 concentrates on the solder of the upper layer 103b disposed near the four corners of the adjacent sides of the rectangular outside shape of the semiconductor chip 101 in a cooling process after the solder of the upper layer 103b is melted, the concentrated thermal stress is directly transmitted immediately under the lower metal 103a disposed near the four corners of the semiconductor chip 101. Thus, the fragile low dielectric constant film 102 may be peeled off or cracked directly under electrode terminals (not shown) disposed near the four corners of the semiconductor chip 101. For example, the fragile low dielectric constant film 102 is peeled off as shown in the lower part of FIG. 5 that is an enlarged view of a principle part.

If a semiconductor device manufactured by the semiconductor device manufacturing method disclosed in Patent Literature 2 is used with a large temperature difference, a thermal stress may be similarly concentrated in such a use environment. Thus, the fragile low dielectric constant film 102 may be peeled off or cracked immediately under the electrode terminals of the semiconductor chip 1.

An object of the present invention is to provide a semiconductor device manufacturing method and a semiconductor device manufactured by the manufacturing method which can obtain high connection reliability even if a semiconductor chip has a fragile film.

Solution to Problem

A semiconductor device manufacturing method according to the present invention is a semiconductor device manufacturing method for manufacturing a semiconductor device in which a semiconductor chip having a plurality of protruding electrodes is mounted on a semiconductor substrate, the method including: a first step of forming a plurality of solder bonding sections that join the protruding electrodes of the semiconductor chip and a plurality of electrodes on the semiconductor substrate by melting a plurality of solder sections in a state in which the protruding electrodes of the semiconductor chip are in contact with the electrodes on the semiconductor substrate via the solder sections; a second step of causing the solder bonding sections to vary in height by extending at least some of the solder bonding sections while a distance between a part of the semiconductor chip and the semiconductor substrate is larger than a distance between the other part of the semiconductor chip and the semiconductor substrate; a third step of forming holes at least in the solder bonding section having a maximum height out of the solder bonding sections; and a fourth step of solidifying the solder bonding sections so as to electrically connect the protruding electrodes of the semiconductor chip to the electrodes of the semiconductor substrate.

A semiconductor device according to the present invention is a semiconductor device in which a semiconductor chip having a plurality of protruding electrodes is mounted on a semiconductor substrate, the semiconductor device including a plurality of solder bonding sections that electrically connect the protruding electrodes of the semiconductor chip to a plurality of electrodes formed on the semiconductor substrate, wherein the solder bonding sections vary in height, and at least the solder bonding section having a maximum height contains holes.

Advantageous Effects of Invention

According to the present invention, the holes may be contained in the solder bonding section that receives a concentrated thermal stress in a cooling step after solder is melted in a flip-chip packaging step. If the semiconductor chip has a rectangular outside shape, a thermal stress frequently concentrates on the solder bonding sections that are diffusion-bonded to the protruding electrodes located near the four corners of the adjacent sides of the outside shape. The solder bonding sections containing the holes are soft and are easily extended, thereby reducing a thermal stress transmitted immediately under the protruding electrodes connected to the solder bonding sections containing the holes. This can reduce a thermal stress received by a fragile low dielectric constant film formed immediately under the electrodes of the semiconductor chip, thereby preventing peeling and cracking of the fragile low dielectric constant film. Hence high connection reliability can be obtained.

DESCRIPTION OF EMBODIMENTS (First Embodiment)

FIGS. 1 and 2A to 2D show a first embodiment.

Figure 1:
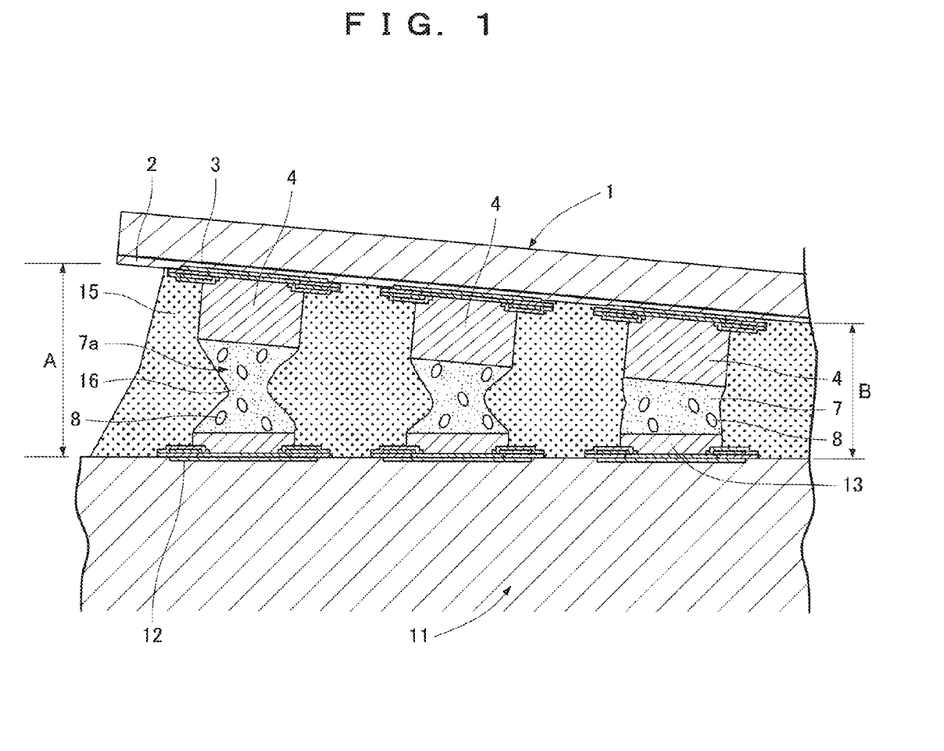
FIG. 1 is a cross-sectional view conceptually showing the principal part of a semiconductor device according to a first embodiment of the present invention.

FIG. 1 is an enlarged cross-sectional view of a semiconductor device according to the first embodiment. As shown in FIG. 1, a semiconductor chip 1 having a plurality of protruding electrodes 4 is mounted on a semiconductor substrate 11. FIGS. 2A to 2D show the manufacturing process of the semiconductor device according to the first embodiment. For example, the semiconductor chip 1 is an LSI chip including multiple electrode terminals 3 with small pitches on a surface (electrode surface) near the semiconductor substrate 11. The pitch of the electrode terminal 3 is a center distance between the adjacent electrode terminals.

On the semiconductor chip 1, a multi-wiring layer 2 including, for example, a fine wiring layer made of Cu or Al and a fragile low dielectric constant insulting film (e.g., a Low-k layer or an Ultra Low-k layer) is provided inside the electrode surface having the electrode terminals 3. On the outermost surface of the multi-wiring layer 2, the electrode terminals 3 are provided over the electrode surface of the semiconductor chip 1.

The electrode terminal 3 is made of, for example, Al or Cu. A seed layer made of Ti/Cu, Ti/W/Cu, or other materials is provided on the surface of the electrode terminal 3. The protruding electrode 4 made of a metal wetted with solder is provided on the surface of the seed layer. The protruding electrode 4 is made of Cu, Ni/Au, Au, or other materials.

For example, the semiconductor substrate 11 is made of silicon. On the semiconductor substrate 11, electrode terminals 12 are provided so as to face the protruding electrodes 4 of the semiconductor chip 1. The electrode terminal 12 is made of, for example, an electrolytic Ni/Au, an electrolytic Ni/Pd/Au, or other materials. A seed layer is provided on the surface of the electrode terminal 12. A protruding electrode 13 is provided on the surface of the seed layer.

The protruding electrodes 4 of the semiconductor chip 1 are electrically and mechanically connected to the protruding electrodes 13 of the semiconductor substrate 11 via solder bonding sections 7. A solid-liquid diffusion reaction firmly joins the solder bonding sections 7 and the protruding electrodes 4 and firmly joins the solder bonding sections 7 and the protruding electrodes 13.

The solder bonding sections 7 vary in height. In the first embodiment, a distance between the semiconductor chip 1 and the semiconductor substrate 11 is maximized (A in FIG. 1) on the outermost end of the semiconductor chip 1. In this case, a solder bonding section 7a joined to the protruding electrode 4 disposed near the outermost end of the semiconductor chip 1 has a maximum height. At the center of the semiconductor chip 1, the distance between the semiconductor chip 1 and the semiconductor substrate 11 may be maximized. In this case, the solder bonding section 7 joined to the protruding electrode 4 disposed at or near the center of the semiconductor chip 1 has a maximum height, also in second and third embodiments, which will be described later.

The solder bonding section 7a with the maximum height includes a constricted part 16 having a small cross-sectional area at the center in a vertical direction. In the first embodiment, the solder bonding section 7 located near the center of the semiconductor chip 1 has a barrel shape.

The highest solder bonding section 7a has the largest ratio of holes 8. This is because the solder bonding section 7a with the maximum height includes the constricted part 16 having a small cross-sectional area.

The solder bonding section 7a with the maximum height is located at a position where a thermal stress most concentrates in a cooling step after solder is melted in a flip-chip packaging process. In the first embodiment, a thermal stress concentrates on the solder bonding sections 7 located near the four corners of the adjacent sides of the outside shape of the rectangular semiconductor chip 1. The solder bonding sections 7 located near the corners of the semiconductor chip 1 include the solder bonding section 7a located near the outermost end of the semiconductor chip 1. Thus, a thermal stress most concentrates on the solder bonding section 7a with the maximum height located near the outermost end of the semiconductor chip 1. In this way, a maximum thermal stress is applied to the solder bonding section 7a located with the maximum distance between the semiconductor chip 1 and the semiconductor substrate 11 near the outermost end of the semiconductor chip 1. The solder bonding section 7a that receives the maximum thermal stress includes the constricted part 16 with a small cross-sectional area and thus has the largest ratio of the holes 6, resulting in a small ratio of solder. Thus, when the solder bonding section 7a with the maximum height receives a tensile stress, a stress further concentrates on the solder section, shifting a stress concentration point from the multi-wiring layer 2, which is a fragile film, to the solder bonding section 7a. However, as has been discussed, the solder bonding section 7a with a large ratio of the holes 8 has a large elongation. Moreover, the solder bonding section 7a is firmly joined to the protruding electrode 4 and the protruding electrode 13. Thus, even a large thermal stress only extends the solder bonding section 7a but does not cause damage. This provides a high ratio of holes for the solder bonding section receiving a largest thermal stress, thereby preventing peeling and cracking of the fragile low dielectric constant film of the multi-wiring layer 2.

The composition of solder can be selected from SnAg, SnAgCu, SnZn, SnZnBi, SnPb, SnBi, SnAgBiIn, SnIn, In, Sn, and so on. The composition of solder is preferably selected in consideration of the elongation of solder according to the maximum distance A.

For example, if a center distance (the pitch of the electrode terminals 3) between the electrode terminals 3 of the semiconductor chip 1 is 0.05 mm, the protruding electrode 4 is 0.020 mm to 0.035 mm in diameter, the protruding electrode 4 is 0.005 mm to 0.030 mm in height, the protruding electrode 13 of the semiconductor substrate 11 is 0.015 mm to 0.035 mm in diameter, the protruding electrode 13 is 0.002 mm to 0.010 mm in height, and the solder bonding section 7 is 0.02 mm to 0.035 mm in diameter.

Molding resin 15 may be injected between the semiconductor chip 1 and the semiconductor substrate 11. The injection of the molding resin 15 improves reliability.

The semiconductor device can be manufactured in steps illustrated in FIGS. 2A to 2D.

When the protruding electrodes 4 are formed on the semiconductor chip 1, a seed layer is first formed over the electrode surfaces of the semiconductor chips 1 in a wafer by sputtering or evaporation, and then a photoresist layer is formed thereon. Subsequently, predetermined points for the protruding electrodes 4 are exposed, and then the photoresist layer is cleaned. The exposure and cleaning form the openings of the photoresist layer at the predetermined formation portions for the protruding electrodes 4 on the electrode terminals 3. Subsequently, the semiconductor chips 1 in the wafer are dipped into an electrolytic plating bath. This forms the protruding electrodes 4 on the electrode terminals 3.

Solder films 6, which are an example of the solder section, are formed on the protruding electrodes 4, and then flux is applied over the electrode surfaces of the semiconductor chips 1 in the wafer. The semiconductor chips 1 in the wafer are heated in a reflow furnace. This melts the solder films 6 into dome shapes. In the melting step of the solder films 6, the solder film 6 and the protruding electrode 4 are diffusion bonded to each other, forming an alloy layer 5 between the solder film 6 and the protruding electrode 4.

Figure 2A:
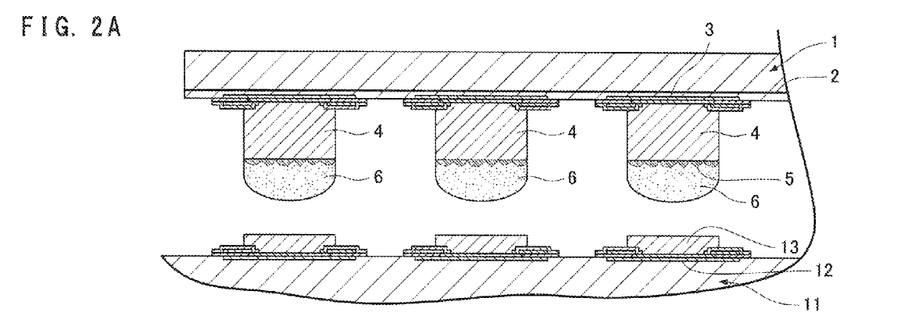
FIG. 2A is a cross-sectional view showing a part of a manufacturing process of a semiconductor device according to the first embodiment of the present invention.

The photoresist layer is then peeled off so as to form the protruding electrodes 4 covered with the solder films 6 on the electrode terminals 3 (see FIG. 2A). For example, the seed layer is made of Ti/Cu, the protruding electrodes 4 are made of Cu, and the solder films 6 are made of SnAg. In this case, the alloy layer 5 is made of $Cu_3Sn$ and $Cu_6Sn_5$. However, the materials of the seed layer, the protruding electrode 4, and the solder film 6 are not limited to these.

Subsequently, the semiconductor chips 1 are separated by blade dicing or laser dicing. The semiconductor chip 1 in FIG. 2A is obtained thus.

The protruding electrodes 13 are formed on the electrode terminals 12 of the semiconductor substrate 11 by electrolytic plating as on the semiconductor chip 1. The protruding electrodes 13 are made of, for example, Ni—P/Au. The material of the protruding electrode 13 is not limited to Ni—P/Au.

Subsequently, the protruding electrodes 4 of the semiconductor chip 1 and the protruding electrodes 13 of the semiconductor substrate 11 are aligned as shown in FIG. 2A, bringing the protruding electrodes 4 into contact with the protruding electrodes 13 via the solder films 6.

Figure 2B:
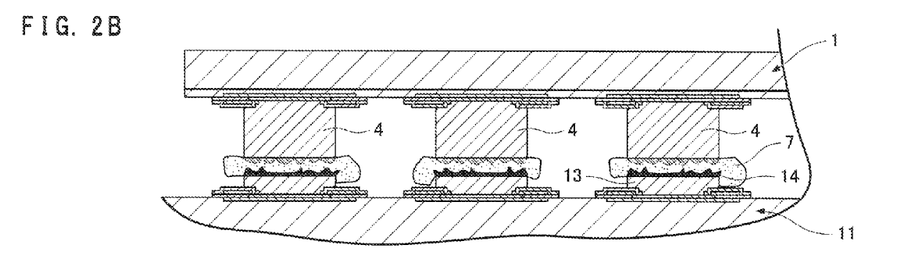
FIG. 2B is a cross-sectional view showing a part of the manufacturing process of the semiconductor device according to the first embodiment.
Figure 2C:
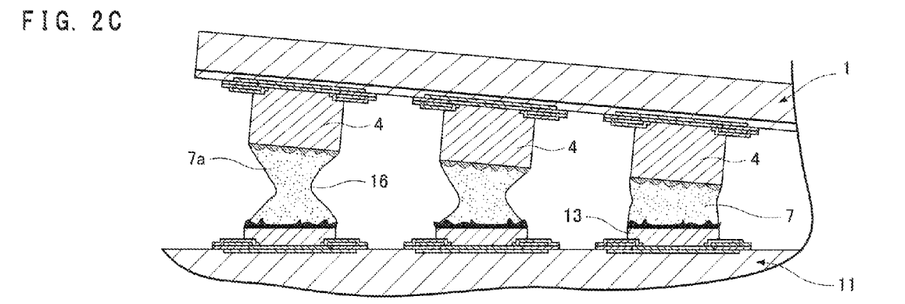
FIG. 2C is a cross-sectional view showing a part of the manufacturing process of the semiconductor device according to the first embodiment.

The semiconductor chip 1 and the semiconductor substrate 11 are heated, and then the semiconductor chip 1 is mounted on the semiconductor substrate 11 as shown in FIG. 2B. For example, the semiconductor chip 1 is preferably pressed to the semiconductor substrate 11 at a heating temperature of 220 to 240° C. in a pressing time of 0.1 to 60 seconds. In this step, the end of the molten solder film 6 and the protruding electrode 13 are diffusion bonded to each other, forming the solder bonding section 7 having an alloy layer 14. If the pressing time is less than 0.1 seconds, a diffusion bonded area between the end of the solder film 6 and the protruding electrode 13 is reduced. In a lifting step (FIG. 2C), which will be described later, molten solder may be disadvantageously torn off. If the pressing time exceeds 60 seconds, the ratio of the alloy layer in the solder bonding section 7 increases while the amount of remaining solder decreases. This reduces the extension of solder in the following lifting step (FIG. 2C). Thus, it is difficult to form the constricted part 16, which will be described later.

Subsequently, in the lifting step of FIG. 2C, the semiconductor chip 1 is heated at least to the melting point of solder so as to lift a part of the semiconductor chip 1 or lift a part of the semiconductor chip 1 more than the other part of the semiconductor chip 1. Thus, a distance between a part of the semiconductor chip 1 and the semiconductor substrate 11 is larger than a distance between the other part of the semiconductor chip 1 and the semiconductor substrate 11, and at least some of the solder bonding sections 7 are melted so as to be extended in a vertical direction relative to the electrode terminals 12 of the semiconductor substrate 11, resulting in variations in the height of the solder bonding sections 7. In the first embodiment, the outer periphery of the semiconductor chip 1 is lifted or the outer periphery of the semiconductor chip 1 is lifted more than the center of the semiconductor chip 1. Thus, a distance between the outer periphery of the semiconductor chip 1 and the semiconductor substrate 11 is larger than a distance between the center of the semiconductor chip 1 and the semiconductor substrate 11. The solder bonding sections 7 bonded to the protruding electrodes 4 provided at least on the outer periphery of the semiconductor chip 1 are melted so as to be extended in the vertical direction relative to the electrode terminals 12 of the semiconductor substrate 11. After that, the solder bonding sections 7 are solidified by cooling.

In order to realize the lifting step of FIG. 2C, the used semiconductor chip 1 is largely warped (thermally warped) by a difference in the coefficient of linear expansion of an internal wiring layer. The semiconductor chip 1 is released with molten solder so as to be warped (thermally warped). The warp may be used as a driving force.

If a warp of the semiconductor chip 1 is used as a driving force for lifting, a tilted part is formed on the semiconductor chip 1. In the first embodiment, a part from the vicinity of the center of the semiconductor chip 1 to the outermost end of the semiconductor chip 1 is tilted such that the outermost end of the semiconductor chip 1 is most separated from the semiconductor substrate 11. The solder bonding sections 7 bonded in a molten state to the protruding electrodes 4 provided on the tilted part are extended in the vertical direction relative to the electrode terminals 12 of the semiconductor substrate 11. The solder bonding section 7a bonded to the protruding electrodes 4 disposed near the outermost end of the semiconductor chip 1 is most extended to a maximum height.

The semiconductor chip 1 includes the internal wiring layer formed on the substrate. Thus, the heated semiconductor chip 1 generates a thermal stress according to a difference in modulus of elasticity and a difference in thermal expansion coefficient between the internal wiring layer and the substrate. As the semiconductor chip 1 decreases in thickness, the substrate becomes less rigid and thus easily warps the semiconductor chip 1 so as to apply a driving force. For example, when a warp of the semiconductor chip 1 having a size of 4 mm×4 mm was measured by a confocal microscope, the semiconductor chips 1 having thicknesses of 0.020 mm, 0.060 mm, and 0.150 mm were warped by 0.026 mm, 0.018 mm, and 0.007 mm, respectively. Thus, in order for a driving force to be sufficiently applied by a warp of the semiconductor chip 1, the semiconductor chip 1 is desirably 0.060 mm or less in thickness. However, if the semiconductor chip 1 is 0.020 mm or less in thickness, a stress applied to the multi-wiring layer 2, which is a fragile film, may damage the semiconductor chip 1. Thus, the semiconductor chip 1 preferably has a thickness t:
0.020 mm<t≤0.060 mm.

In the lifting step of FIG. 2C, the constricted part 16 is formed on the solder bonding section 7a located near the outermost end of the semiconductor chip 1; meanwhile, a small warp is formed near the center of the semiconductor chip 1. The solder bonding section 7 at such a small warp is barrel-shaped.

The extended solder bonding section 7 may contain holes in the lifting step depending upon the conditions. The solder bonding section 7 extended to a maximum height, in particular, is likely to contain holes.

Figure 2D:
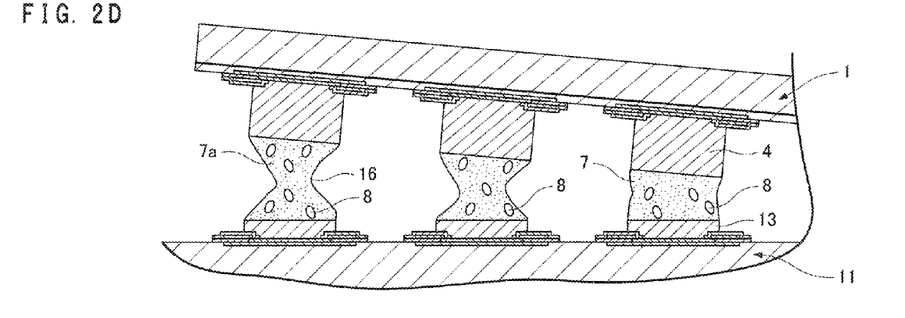
FIG. 2D is a cross-sectional view showing a part of the manufacturing process of the semiconductor device according to the first embodiment.

Subsequently, the semiconductor substrate 11 with the mounted semiconductor chip 1 is heated by a heating apparatus such as a reflow furnace to remelt solder, growing an alloy layer. In this step, $Cu_5Sn_5$ of the alloy layer 5 is largely grown into columnar shapes reaching the alloy layer 14 on the protruding electrode 13, forming an alloy layer made of $(Cu, Ni)_6Sn_5$. At this point, as shown in FIG. 2D, the solder bonding section 7 having a cross-sectional area smaller than an electrode area contains the holes 8 formed by a volume shrinkage along with a structural transformation. The most extended solder bonding section 7a has the largest constricted part 16 and thus has the smallest cross-sectional area. Hence, the most extended solder bonding section 7a has the largest ratio of holes with a small ratio of solder. This easily extends the most extended solder bonding section 7a with a reduced elastic modulus in tension (Young's modulus). In the first embodiment, the solder bonding section 7a located near the outermost end of the semiconductor chip 1 has the largest ratio of holes.

The semiconductor substrate 11 may be heated to grow the alloy layer in a vacuum or in reduced gas. Solder is melted in a vacuum or in reduced gas, reducing the amount of an oxygen film generated while solder is melted. This reduces the amount of the oxygen film interfering with the growth of the alloy layer, facilitating the growth of the alloy layer. The reduced gas may be, for example, carboxylic acid such as formic acid and citric acid.

After that, molding resin (not shown) may be injected between the semiconductor chip 1 and the semiconductor substrate 11 by a dispenser or the like, and then the injected molding resin may be cured. The molding resin infiltrated into the holes 8 can improve the tensile strength of the solder bonding section 7 and reduce the modulus of elasticity of the solder bonding section 7. Thus, a semiconductor chip 1 having lower strength may be used. Since the molding resin is bonded to the solder bonding sections 7 having irregular surfaces, an interface adhesive strength between the molding resin and the solder bonding section 7 is improved by an anchor effect. The semiconductor device can be highly reliable even in a more severe use environment.

The semiconductor device according to the first embodiment was analyzed in cross section by cross-sectioning. Consequently, the solder bonding sections 7 containing the holes 8 disposed near the outermost end of the semiconductor chip 1 were confirmed. Moreover, it was confirmed that the ratio of holes in the solder bonding section 7 disposed on the outer periphery of the semiconductor chip 1 was larger than the ratios of holes in the solder bonding sections 7 disposed on the inner periphery of the semiconductor chip 1. It was also confirmed that the fragile low dielectric constant film was not peeled off or cracked on the outermost end of the semiconductor chip 1. Moreover, it was confirmed that the semiconductor device of the first embodiment under a temperature cycle test (one cycle: −40° C. for thirty minutes, 85° C. for thirty minutes) had a stable connection resistance even after 1000 cycles.

The solder bonding section 7a contains the holes 8 at or near a position where the distance between the semiconductor chip 1 and the semiconductor substrate 11 is maximized. This reduces a stress received by the fragile low dielectric constant film (ULK film), achieving high connection reliability.

The solder bonding section located at the center of the semiconductor chip 1 may receive a maximum thermal stress depending on the conditions in the cooling step after solder is melted in the flip-chip packaging process. In this case, the center of the semiconductor chip may be curved upward with a maximum distance from the semiconductor substrate, also in second and third embodiments which will be described later.

(Second Embodiment)

FIGS. 3A to 3D are cross-sectional views conceptually showing a semiconductor device manufacturing method according to a second embodiment.

In the second embodiment, unlike in the first embodiment, recessed portions 17a are formed on the surfaces (contact surfaces) of the electrodes of a semiconductor substrate 11 so as to be in contact with solder films 6, which are an example of a solder part, before the electrodes of a semiconductor chip 1 are brought into contact with the electrodes of the semiconductor substrate 11 via the solder films 6. Other configurations are identical to those of the first embodiment and thus the explanation thereof is omitted.

Figure 3A:
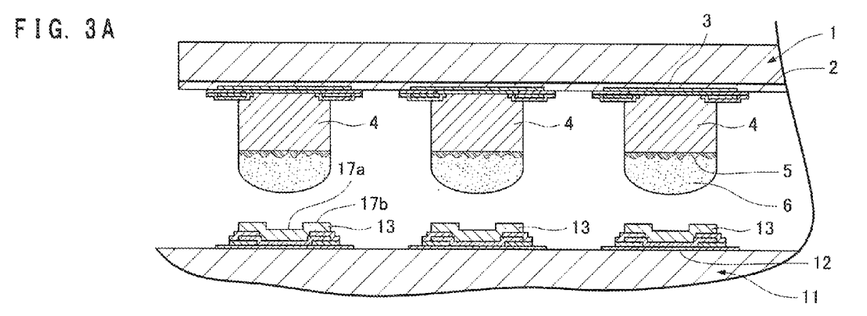
FIG. 3A is a cross-sectional view showing a part of a manufacturing process of a semiconductor device according to a second embodiment of the present invention.

Before protruding electrodes 13 are formed on the semiconductor substrate 11, electrode terminals 12 (seed layer) are each covered with an insulating film having an opening at the center. After that, the protruding electrodes 13 are formed by electrolytic plating. As shown in FIG. 3A, the insulating film having a small opening size forms the recessed portion 17a on the protruding electrode 13 according to the thickness of the insulating film. For example, if the electrode terminal 12 has a diameter of 0.025 mm, it is preferable that the insulating film has an opening size of 0.015 mm and the insulating film has a thickness of 0.001 mm to 0.002 mm.

Figure 3B:
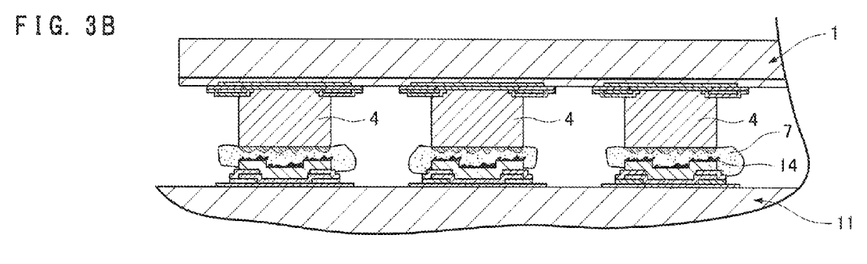
FIG. 3B is a cross-sectional view showing a part of the manufacturing process of the semiconductor device according to the second embodiment of the present invention.

As shown in FIG. 3B, the semiconductor chip 1 and the semiconductor substrate 11 are heated, and then the semiconductor chip 1 is mounted on the semiconductor substrate 11. At this point, the end of the molten solder film 5 and the protruding electrode 13 are diffusion bonded to each other, forming a solder bonding section 7 having an alloy layer 14.

Figure 3C:
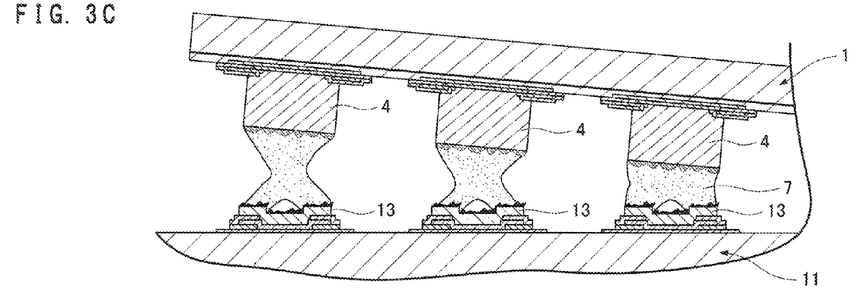
FIG. 3C is a cross-sectional view showing a part of the manufacturing process of the semiconductor device according to the second embodiment of the present invention.

As shown in FIG. 3C, the semiconductor chip 1 is then heated at least to the melting point of the solder bonding section 7, raising the outermost end of the semiconductor chip 1. In the second embodiment, as in the first embodiment, a part ranging from the vicinity of the center of the semiconductor chip 1 to the outermost end of the semiconductor chip 1 is tilted so as to maximize a distance between the outermost end of the semiconductor chip 1 and the semiconductor substrate 11.

In the lifting step of FIG. 3C, solder wet on the recessed portions 17a of the protruding electrodes 13 is lifted. The lifted solder is concentrated on solder on projecting portions 17b around the recessed portions 17a by a solder surface tension. Hence, in the extended solder bonding sections 7, the recessed portions 17a do not get wet with solder but the projecting portions 17b around the recessed portions 17a get wet with solder. Thus, in the lifting step, holes 8 are formed in a solder bonding section 7a located near the outermost end of the semiconductor chip 1. The solder sections have smaller cross-sectional areas than in the first embodiment.

Figure 3D:
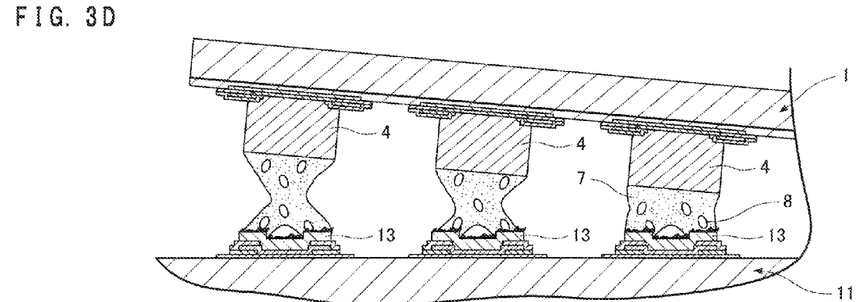
FIG. 3D is a cross-sectional view showing a part of the manufacturing process of the semiconductor device according to the second embodiment of the present invention.

Subsequently, the semiconductor substrate 11 with the mounted semiconductor chip 1 is heated so as to melt solder again by a heating apparatus such as a reflow furnace. Thus, as shown in FIG. 3D, the solder bonding sections 7 are formed with a larger number of the holes 8 than in the first embodiment.

The solder bonding sections including a larger number of the holes 8 reduce a thermal stress in a use environment, thereby suppressing a break on a fragile film.

The semiconductor device according to the second embodiment was analyzed in cross section by cross-sectioning. Consequently, it was confirmed that a distance between the semiconductor chip 1 and the semiconductor substrate 11 was maximized on the outermost end of the semiconductor chip 1 and the solder bonding section 7a located near the outermost end of the semiconductor chip 1 had eight holes. It was also confirmed that even when a fragile low dielectric constant film was an ELK (Extreme Low-k) film, the film was not peeled off or cracked on the outermost end of the semiconductor chip 1. Moreover, it was confirmed that the semiconductor device of the second embodiment under a temperature cycle test (one cycle: −45° C. for five minutes, 85° C. for five minutes) had stable connection resistance even after 1000 cycles.

Forming of the recessed portions 17a on the protruding electrodes 13 of the semiconductor substrate 11 can form a larger number of the holes 8 in the solder bonding sections 7, thereby reducing a stress received by the fragile low dielectric constant film with high connection reliability.

(Third Embodiment)

FIGS. 4A to 4E are cross-sectional views conceptually showing a semiconductor device manufacturing method according to a third embodiment.

In the first and second embodiments, the length of the solder bonding section 7a located near the outermost end of the semiconductor Chip 1 is controlled so as to curve the semiconductor chip 1 and the minimum cross-sectional area of the solder bonding section 7a is controlled by forming the constricted part 16 on the solder bonding section 7a, thereby reducing the elasticity of the solder bonding section 7a. However, the elasticity of the solder bonding section 7a located near the outermost end of the semiconductor chip 1 can be reduced only by controlling the length of the solder bonding section 7a.

In the third embodiment, unlike in the first embodiment, protruding electrodes 13 having rounded corners are formed on electrode terminals 12 of a semiconductor substrate 11. Thus, rounded portions 18 are formed on the corners of the protruding electrodes 13 of the semiconductor substrate 11, the protruding electrodes 13 coming into contact with protruding electrodes 4 of a semiconductor chip 1 via solder films 6. Other configurations are identical to those of the first embodiment and thus the explanation thereof is omitted.

Figure 4A:
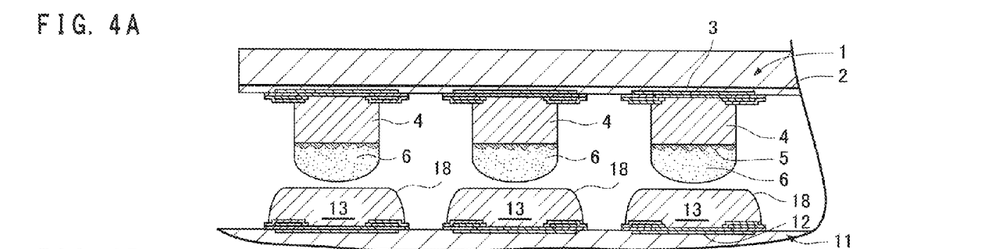
FIG. 4A is a cross-sectional view showing a part of a manufacturing process of a semiconductor device according to a third embodiment of the present invention.

The protruding electrodes 13 are formed by electroless plating. For example, the protruding electrode 13 is 0.035 mm in diameter and is 0.010 mm in thickness. As shown in FIG. 4A, the protruding electrodes 13 are isotropically grown and thus the corners of the protruding electrodes 13 are formed into the rounded portions 18.

Figure 4B:
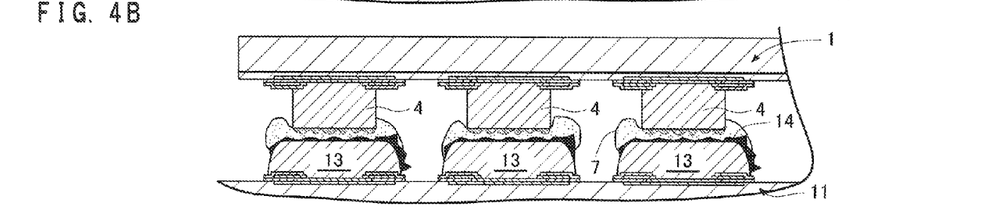
FIG. 4B is a cross-sectional view showing a part of the manufacturing process of the semiconductor device according to the third embodiment of the present invention.

Subsequently, as shown in FIG. 4B, the semiconductor chip 1 with the molten solder films 6 is mounted on the semiconductor substrate 11, and then an alloy layer 14 is formed on the protruding electrode 13. At this point, as shown in FIG. 4B, solder wets and spreads along the shapes of the rounded portions 18 of the protruding electrodes 13.

Figure 4C:
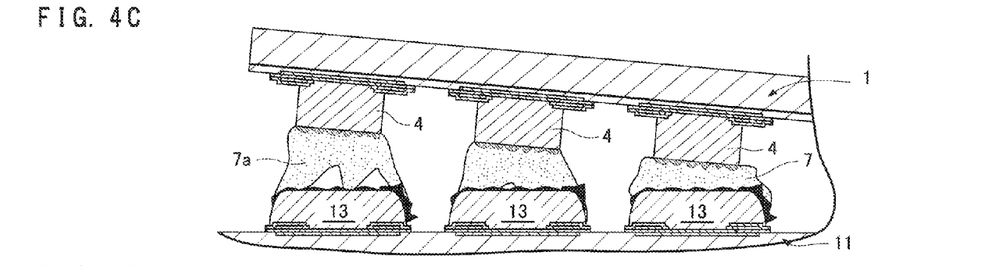
FIG. 4C is a cross-sectional view showing a part of the manufacturing process of the semiconductor device according to the third embodiment of the present invention.

Subsequently, as shown in FIG. 4C, the outermost end of the semiconductor chip 1 is lifted with molten solder bonding sections 7, and then the solder bonding sections 7 are cooled to the freezing point of solder so as to be solidified. In the third embodiment, as in the first embodiment, a part ranging from the vicinity of the center of the semiconductor chip 1 to the outermost end of the semiconductor chip 1 is tilted with a maximum distance between the outermost end of the semiconductor chip 1 and the semiconductor substrate 11.

In the lifting step of FIG. 4C, an extended solder bonding section 7a contain holes 8. This is because the amount of solder between the top faces of the upper and lower protruding electrodes 4 and 13 is smaller than those of the first and second embodiments according to the wetting and spread of solder along the shapes of the rounded portions 18 of the protruding electrodes 13.

Figure 4D:
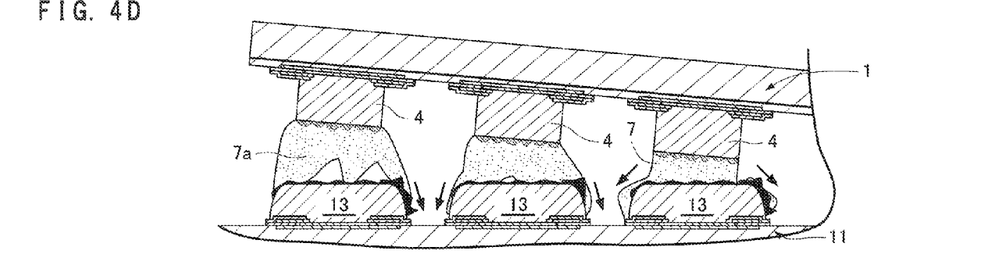
FIG. 4D is a cross-sectional view showing a part of the manufacturing process of the semiconductor device according to the third embodiment of the present invention.
Figure 4E:
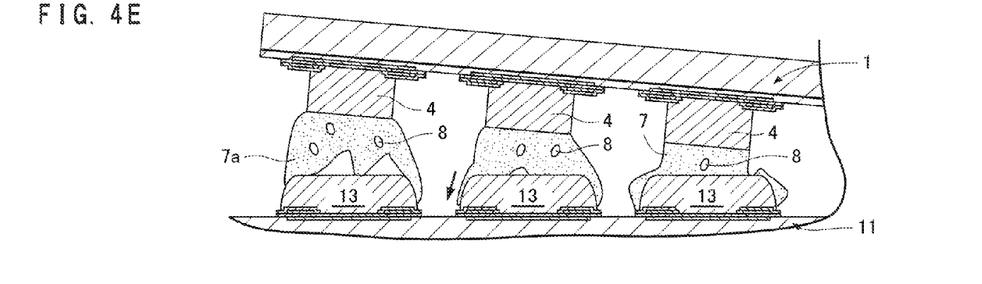
FIG. 4E is a cross-sectional view showing a part of the manufacturing process of the semiconductor device according to the third embodiment of the present invention.

Subsequently, a package composed of the semiconductor chip 1 and the semiconductor substrate 11 is placed into a reflow furnace to remelt the solder bonding sections 7. Thus, as shown in FIG. 4D, solder further wets and spreads along the shapes of the rounded portions 18 of the protruding electrodes 13. The solder wetting and spreading on the rounded shapes of the outer surfaces of the protruding electrodes 13 reduces the volume of remelted solder between the top faces of the upper and lower protruding electrodes 4 and 13 more than in the first and second embodiments. Thus, as shown in FIG. 4E, the solder bonding section 7a located near the outermost, end of the semiconductor chip 1 contains a larger number of the holes 8 than in the first and second embodiments with the passage of time. Consequently, the solder bonding section 7a at a maximum height is less elastic. This can reduce a thermal stress to a large semiconductor chip, even though it is difficult to use a fragile dielectric film for the semiconductor chip because of a thermal stress increased by known bumps, and enables a fragile dielectric film to be used for a large semiconductor chip.

The second embodiment may be combined with the third embodiment.

In the first to third embodiments, the semiconductor chip 1 is mounted on the semiconductor substrate 11. The present invention is not limited to this example. The same effects as in the first to third embodiments can be obtained even if the present invention is applied to electrical components including mounted passive components such as a capacitor, a coil, and a resistor with electrode terminals at small pitches. Moreover, in the first to third embodiments, the semiconductor chip is a wafer type. The present invention is not limited to this example. Even in the case of a package including a semiconductor chip mounted on a printed circuit board or even if separating semiconductor chips having rectangular or square outside shapes are used from the beginning, the same effects as in the first to third embodiments can be obtained. Furthermore, an electronic circuit or a semiconductor circuit may be configured on or inside the surface of the semiconductor substrate 11. Hence, the semiconductor substrate 11 may be a semiconductor chip.

INDUSTRIAL APPLICABILITY

The present invention is particularly useful in the field of packaging a semiconductor chip having smaller pitches or a semiconductor chip including an interlayer insulating film made of a low dielectric constant material.

The invention claimed is:
1. A semiconductor device manufacturing method for manufacturing a semiconductor device in which a semiconductor chip having a plurality of protruding electrodes is mounted on a semiconductor substrate, the method comprising:

a first step of forming a plurality of solder bonding sections that join the protruding electrodes of the semiconductor chip and a plurality of electrodes on the semiconductor substrate by melting a plurality of solder sections in a state in which the protruding electrodes of the semiconductor chip are in contact with the electrodes on the semiconductor substrate via the solder sections;

a second step of causing the solder bonding sections to vary in height by extending at least some of the solder bonding sections while a distance between a part of the semiconductor chip and the semiconductor substrate is larger than a distance between the other part of the semiconductor chip and the semiconductor substrate;

a third step of forming holes at least in the solder bonding section having a maximum height out of the solder bonding sections; and a fourth step of solidifying the solder bonding sections so as to electrically connect the protruding electrodes of the semiconductor chip to the electrodes of the semiconductor substrate wherein at least two of the solder bonding sections contain holes with different ratios.

2. The semiconductor device manufacturing method according to claim 1, wherein the second step includes formation of a constricted part with a smaller cross-sectional area at least on the solder bonding section having the maximum height.

3. The semiconductor device manufacturing method according to claim 2, wherein the second step includes formation of a tilted part on the semiconductor chip with respect to the semiconductor substrate.

4. The semiconductor device manufacturing method according to claim 3, wherein in the third step, the holes are formed by remelting the solder bonding sections.

5. The semiconductor device manufacturing method according to claim 1, further comprising forming recessed portions on the electrodes of the semiconductor substrate before the first step, wherein in the second step, holes are formed at least in the solder bonding section having the maximum height.

6. The semiconductor device manufacturing method according to claim 1, wherein before the first step, protruding electrodes with rounded corners are formed on a plurality of electrode terminals formed on the semiconductor substrate to form the electrodes of the semiconductor substrate, and in the second step, holes are formed at least in the solder bonding section having the maximum height.

7. A semiconductor device in which a semiconductor chip having a plurality of protruding electrodes is mounted on a semiconductor substrate, the semiconductor device comprising a plurality of solder bonding sections that electrically connect the protruding electrodes of the semiconductor chip to a plurality of electrodes formed on the semiconductor substrate, wherein the solder bonding sections vary in height, at least the solder bonding section having a maximum height contains holes, and at least two of the solder bonding sections contain holes with different ratios.

8. The semiconductor device according to claim 7, wherein at least the solder bonding section having the maximum height includes a constricted part with a smaller cross-sectional area.

9. The semiconductor device according to claim 8, wherein the semiconductor chip has a tilted part with respect to the semiconductor substrate.

10. The semiconductor device according to claim 7, wherein each of the electrodes of the semiconductor substrate includes a recessed portion.

11. The semiconductor device according to claim 7, wherein each of the electrodes of the semiconductor substrate includes a protruding electrode having rounded corners.

12. The semiconductor device according to claim 7, wherein the solder bonding section provided on an outer periphery of the semiconductor chip contains holes with a higher ratio than the solder bonding section provided on an inner periphery of the semiconductor chip.

* * * * *